United States Patent [19]

Sakamoto et al.

[11] Patent Number: 4,565,992
[45] Date of Patent: Jan. 21, 1986

[54] ANALOG TO DIGITAL CONVERTER

[75] Inventors: Shigemi Sakamoto, Kawasaki; Satoru Saito, Yokohama, both of Japan

[73] Assignee: Tokyo Shibaura Denki Kabushiki Kaisha, Kawasaki, Japan

[21] Appl. No.: 442,589

[22] Filed: Nov. 18, 1982

[30] Foreign Application Priority Data

Dec. 2, 1981 [JP] Japan .................................. 56-193802
Dec. 2, 1981 [JP] Japan .................................. 56-193803

[51] Int. Cl.⁴ ............................................. H03K 13/02
[52] U.S. Cl. .............................................. 340/347 AD
[58] Field of Search ................. 340/347 AD; 307/228; 328/181, 185

[56] References Cited

U.S. PATENT DOCUMENTS

| 3,534,257 | 10/1970 | Charap et al. | 340/347 AD |
| 3,665,305 | 5/1972 | Petrohilos | 340/347 AD |
| 4,218,675 | 8/1980 | Shaw et al. | 340/347 AD |
| 4,243,975 | 1/1981 | Masuda et al. | 340/347 NT |
| 4,291,299 | 9/1981 | Hinz et al. | 340/347 AD |
| 4,393,371 | 7/1983 | Morgan-Smith | 340/347 AD |
| 4,415,869 | 11/1983 | Duijkers | 307/228 |
| 4,504,741 | 3/1985 | Armitage | 307/227 |

OTHER PUBLICATIONS

Schmid, Hermann, *Electronic Analog/Digital Conversions*, 1970, pp. 275-279.

Primary Examiner—Errol A. Krass
Assistant Examiner—Heather R. Herndon
Attorney, Agent, or Firm—Finnegan, Henderson, Farabow, Garrett & Dunner

[57] ABSTRACT

An A/D converter comprises an integrator circuit adapted to receive a first negative reference voltage at a first node and act as a voltage follower and adapted to integrate a second reference voltage with a capacitor at a second mode, the second reference voltage is more positive than the first reference voltage, a comparator for comparing an integrator output with a ground level and an analog input level at a second mode, and a counter for counting clock pulses when an integrator output is between the ground level and the analog input level.

6 Claims, 19 Drawing Figures

ANALOG TO DIGITAL CONVERTER

BACKGROUND OF THE INVENTION

This invention relates to an analog to digital converter.

A dual slope type analog to digital (A/D) converter with an integrator circuit is now being extensively used because highly accurate digital output values are obtained. In such an A/D converter, a reference voltage and analog input voltage are selectively input to the integrator circuit and the output of the integrator circuit is supplied to a zero cross comparator. The analog voltage is integrated over a predetermined time interval and then the integrated output of the integrator circuit is discharged by connecting the reference voltage to the input terminal. During the time period in which the integrated output reaches a 0 level, i.e., an initial value, clock pulses are counted and a count value is produced as an output digital value. The higher the frequency of the clock pulse becomes, the more the A/D converter makes the output value theoretically higher in accuracy. In this connection it should be noted that an operation lag of the zero cross comparator may be a cause for errors. Moreover, the A/D converter cannot assure a high-speed operation because a discharge period is involved during the operation of the A/D conversion.

SUMMARY OF THE INVENTION

It is accordingly the object of this invention to provide an analog to digital converter which assures a high-speed operation as well as permitting a high-precision output. This object can be achieved by an analog to digital converter which comprises a circuit adapted to act as a voltage follower circuit at a first mode and to act as an integrator circuit producing an output of a predetermined slope at a second mode, a comparator for comparing the output of the integrator circuit with a reference level and an analog input level, and a counter for counting pulse signals during a time interval in which the output of the integrator circuit is present between the reference level and the analog input level.

BRIEF DESCRIPTION OF THE DRAWINGS

FIGS. 4A to 4K are a timing chart showing an operation of the A/D converter of FIG. 3.

DETAILED DESCRIPTION OF THE PREFERRED EMBODIMENTS

An A/D converter according to one embodiment of this invention will now be described below by referring to the accompanying drawings.

Figure 1:
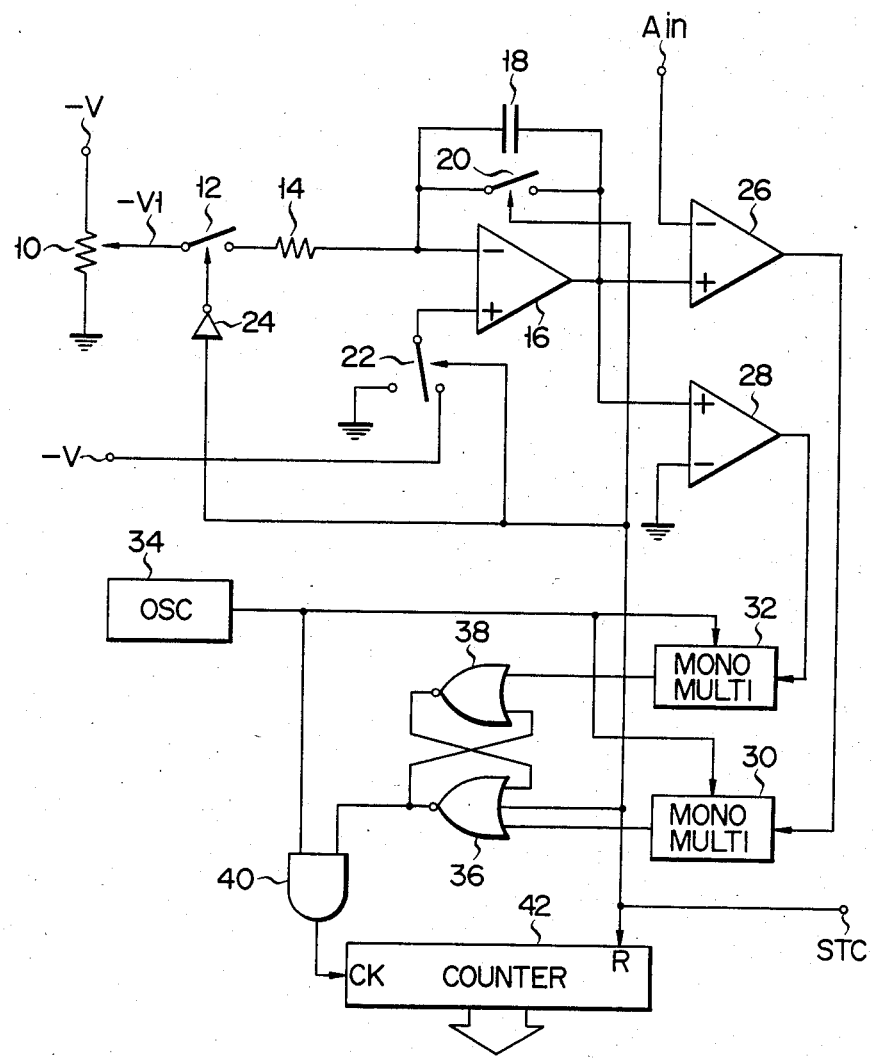
FIG. 1 is a circuit diagram showing an A/D converter according to one embodiment of this invention.

FIG. 1 is a circuit diagram showing the A/D converter according to one embodiment of this invention. A negative power supply terminal $-V$ is grounded through a variable resistor 10. The value of the variable resistor 10 is set according to a resolution of the A/D converter. A reference voltage $-V1$ obtained through a slider on the variable resistor 10 is supplied to an inverting input terminal of an operational amplifier 16 through a series circuit of a switch 12 and resistor 14. A parallel circuit of a capacitor 18 and switch 20 is connected between an output terminal and an inverting input terminal of the operational amplifier 16 and provides, together with the operational amplifier 16, an integrator circuit. A noninverting input terminal of the operational amplifier 16 is connected through a switch 22 to a ground or the negative power supply terminal $-V$.

A conversion start control terminal STC is connected to control terminals of the switches 20 and 22 and through an inverter 24 to a control terminal of the switch 12. The switch 12 is open and the switch 20 is closed when a logical 1 control signal is supplied. The switch 22 is switched to the negative power supply terminal $-V$ when the control signal of a logical 1 level is supplied.

The output terminal of the operational amplifier 16 is connected to noninverting input terminals of comparators 26 and 28. An analog input terminal Ain is connected to an inverting terminal of the comparator 26. An inverting input terminal of the comparator 28 is grounded. The output terminals of the comparators 26 and 28 are connected to input terminals of monostable multivibrators 30 and 32, respectively. An output signal of an oscillator 34 is supplied to clock terminals of the monostable multivibrators 30 and 32.

The output signals of the monostable multivibrators 30 and 32 are respectively supplied to NOR gates 36 and 38 which provide a flip-flop circuit. The conversion start control terminal STC is connected to the NOR gate 36. The output signal of the NOR gate 36 and output signal of the oscillator 34 are fed through an AND gate 40 to a clock terminal CK of a counter 42. The conversion start control terminal STC is connected to a reset terminal R of the counter 42. The output signal of the counter 42 is taken out as a converter output.

The operation of the A/D converter of FIG. 1 will be explained below by referring to FIGS. 2A to 2F.

Figure 2:
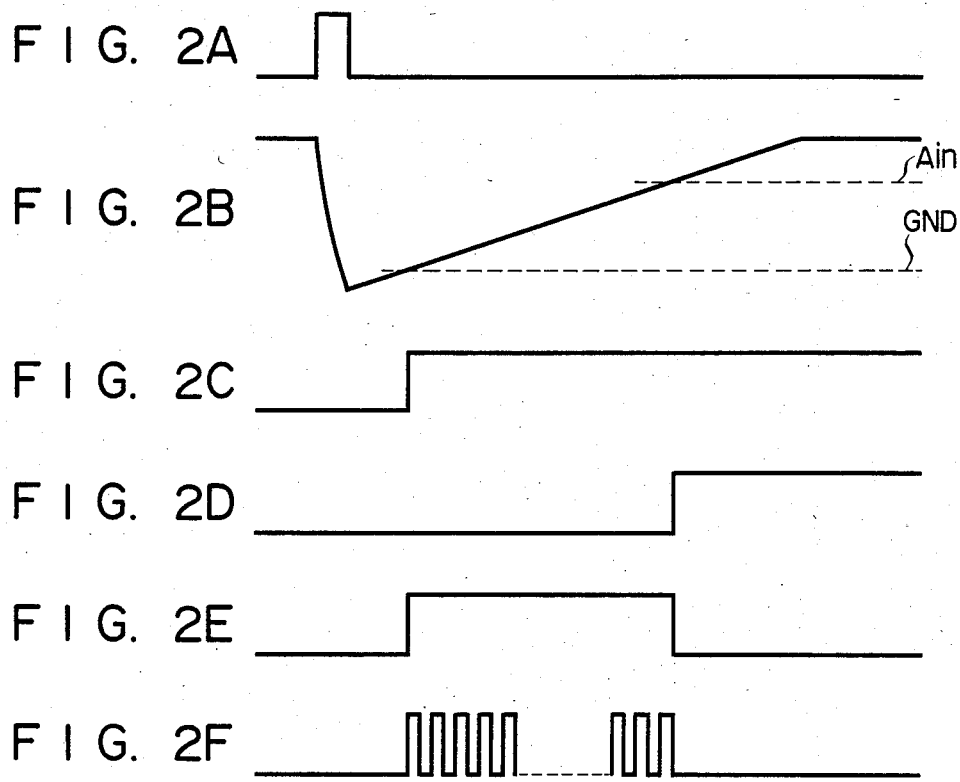
FIGS. 2A to 2F are a timing chart showing an operation of the A/D converter of FIG. 1.

When a conversion start control signal STC becomes logical 1 as shown in FIG. 2A, the switch 12 is nonconductive, the switch 20 is conductive and the switch 22 is switched to the negative power supply terminal $-V$. As a result, the operational amplifier 16 serves as the voltage follower circuit and the output signal of the amplifier 16 falls toward the negative power supply terminal $-V$ as shown in FIG. 2B. At the same time, the counter 42 is reset. When the conversion start control signal STC becomes logical 0, the states of the switches 12, 20 and 22 are reversed and the capacitor 18 integrates the reference voltage $-V1$. For this reason, the output signal of the operational amplifier 16 rises with a predetermined slope, as shown in FIG. 2B. The slope corresponds to the level of the reference voltage $-V1$.

When the output signal of operational amplifier 16 reaches a ground level GND, the output signal of the comparator 28 is inverted to a logical 1, as shown in FIG. 2C. The monostable multivibrator 32 detects the edge of a rise of the output signal of the comparator 28 and delivers a logical 1 output signal for a predetermined time interval causing the flip-flop circuit to be set. That is, the output signal of the NOR gate 36 becomes logical 1 as shown in FIG. 2E. The output pulses of the oscillator 34 are supplied through the AND gate 40 to the counter 42 as shown in FIG. 2F, where a counting operation is started.

When the output signal of the operational amplifier 16 reaches an analog input level Ain, the output signal of the comparator 26 is inverted as shown in FIG. 2D to logical 1 level. The monostable multivibrator 30 detects the edge of a rise of this signal and supplies a logical 1 output signal over a predetermined time interval causing the flip-flop circuit to be reset. The output signal of the NOR gate 36 becomes logical 0 as shown in FIG. 2E stopping a supply of pulses through the AND gate 40 to the counter 42 as shown in FIG. 2F.

Since the operation time of the counter 42 of FIG. 1 is from the time in which the output signal of the operational amplifier 16 which has the predetermined slope becomes the ground level GND to the time in which the output signal of the operational amplifier reaches the analog input level Ain, the count value of the counter 42 corresponds to the analog input level Ain. For this reason, the output signal of the counter 40 becomes a conversion output.

The A/D converter according to the embodiment of FIG. 1, unlike a conventional dual slope type A/D converter, requires no discharge time period thereby assuring a high-speed operation. Even where the comparators 26 and 28 suffer any operation time lags, if they have the same characteristic with the same time lag, any effects resulting from the operation time lag can be cancelled thus permitting a high-precision output value to be obtained.

An A/D converter according to the second embodiment of this invention will be explained below by referring to FIG. 3.

A negative power supply terminal $-V$ is grounded through a variable resistor 50. A value of the variable resistor 50 is set according to the resolution of an A/D conversion. A reference voltage $-V1$ obtained from a slider on the variable resistor 50 is supplied to an inverting input terminal of an operational amplifier 56 through a series circuit of a switch 52 and resistor 54. A parallel circuit of a capacitor 58 and switch 60 is connected between the output terminal and inverting input terminal of the operational amplifier 56 and provides, together with the operational amplifier 56, an integrator circuit. The arrangement so far mentioned is the same as that of the first embodiment.

A noninverting input terminal of the operational amplifier 56 is connected through a switch 62 to a ground and through a switch 64 to the negative power supply terminal $-V$. The output terminal of the operational amplifier 56 is connected to a noninverting input terminal of a comparator 66 and an inverting input terminal of a comparator 68. A reference voltage terminal $-V1$, ground terminal, and analog input terminal Ain are connected respectively through switches 70, 72 and 74 to an inverting input terminal of the comparator 66. A reference voltage $-V2$ obtained through a slider on a variable resistor 76 connected between the negative power supply terminal $-V$ and ground is supplied to a noninverting input terminal of the comparator 68.

Figure 3:
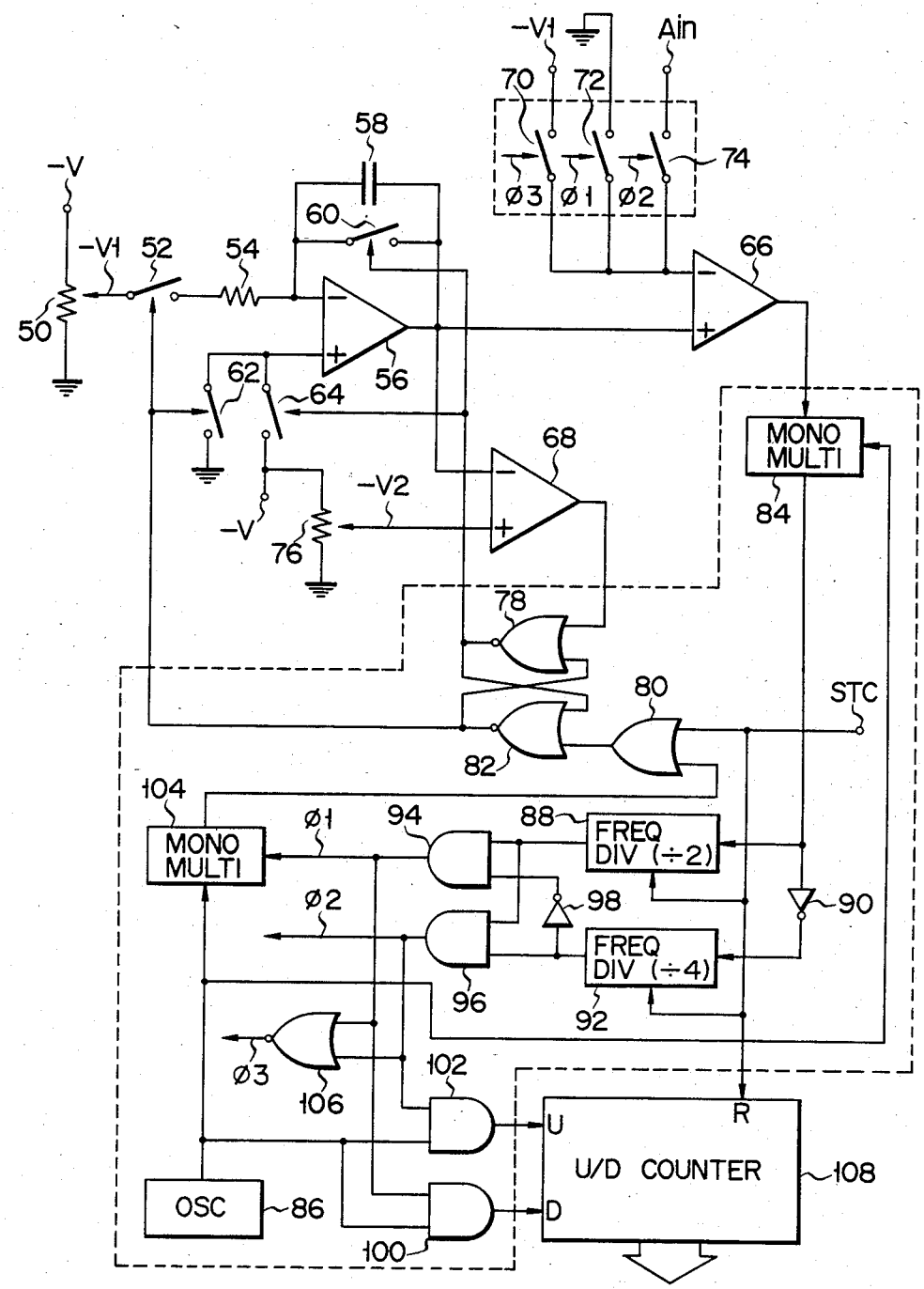
FIG. 3 is a circuit diagram showing an A/D converter according to another embodiment of this invention.

Now suppose in FIG. 3 that the reference voltage $-V1$ is more positive than the reference voltage $-V2$. The output signal of the comparator 68 is supplied to a NOR gate 78. A conversion start control signal STC is supplied through an OR gate 80 to a NOR gate 82. The NOR gates 78 and 82 constitute a flip-flop circuit. The output signal of the NOR gate 78 is supplied to control terminals of the switches 60 and 64. The output signal of the NOR gate 82 is fed to control terminals of the switches 52 and 62. The switches 52, 60, 62 and 64 are conductive when the logical 1 control signal is supplied.

The output signal of the comparator 66 is delivered to a monostable multivibrator 84. An output pulse signal of an oscillator 86 is supplied to a clock terminal of the monostable multivibrator 84. An output signal of the monostable multivibrator 84 is supplied to a set terminal of a frequency divider ($\div 2$) (flip-flop circuit) 88 and through an inverter 90 to a set terminal of a frequency divider ($\div 4$) 92. The conversion start control signal STC is supplied to reset terminals of the frequency dividers 88 and 92. An output signal of the frequency divider 88 is supplied to first input terminals of AND gates 94 and 96. An output signal of the frequency divider 92 is supplied to a second input terminal of the AND gate 94 through an inverter 98 and to a second input terminal of the AND gate 96.

The output signals of the AND gates 94 and 96 are supplied to first input terminals of AND gates 100 and 102, respectively. The output signal of the oscillator 86 is supplied to second terminals of the AND gates 100 and 102. An output signal $\phi 1$ of the AND gate 94 is supplied to an input terminal of a monostable multivibrator 104. The output signal of the oscillator 86 is supplied to a clock terminal of the monostable multivibrator 104. The output signal of the monostable multivibrator 104 is supplied to the OR gate 80. Signals $\phi 1$ and $\phi 2$ are fed to a NOR gate 106. A signal $\phi 3$ is taken from the output terminal of the NOR gate 106.

The signals $\phi 1$, $\phi 2$ and $\phi 3$ are supplied to control terminals of the switches 72, 74 and 70, respectively. The switches 70, 72 and 74 are conductive when a logical 1 control signal is supplied. The output signals of the AND gates 102 and 100 are supplied to an up count terminal U and a down count terminal D, respectively, of an up/down counter 108. A convertion start control switch STC is supplied to a reset terminal R of the counter 106.

The operation of the embodiment shown in FIG. 3 will now be explained below by referring to the timing chart in FIGS. 4A to 4K.

Figure 4C:
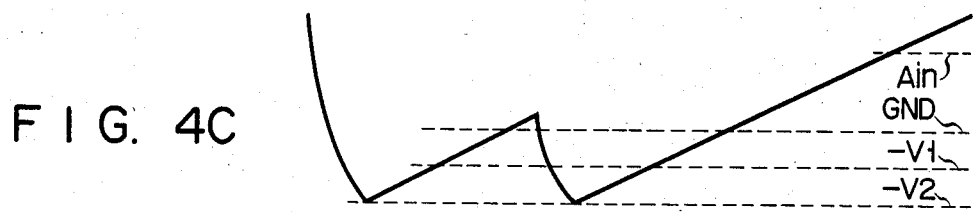

As shown in FIG. 4A, when a conversion start pulse STC of logical 1 is received, the output signal of the NOR gate 82 is set to a logical 0 level as shown in FIG. 4B, and the output signal of the NOR gate 78 is set to a logical 1 level causing the switches 60, 64 to be conductive and the switches 52, 62 to be nonconductive. The operational amplifier 56 acts as a voltage follower circuit, and the output signal of the amplifier 56 falls toward the negative power supply $-V$ as shown in FIG. 4C. At the same time, the frequency dividers 88, 92 and counter 106 are reset. Since the AND gates 94, 96 are rendered OFF, the signals $\phi 1$, $\phi 2$ and $\phi 3$ are at the logical 0, logical 0, and logical 1 level, respectively, as shown in FIGS. 4D, 4E and 4F. For this reason, the switch 70 is conductive to permit the noninverting input terminal of the comparator 66 to be connected to the reference voltage terminal $-V1$.

When the output signal of the operational amplifier 56 becomes more negative than the reference voltage $-V2$, the output level of the comparator 68 becomes logical 1. As a result, the output level of the NOR gate 78 becomes logical 0 and as shown in FIG. 4B the output level of the NOR gate 82 becomes logical 1. The switches 60, 64 are nonconductive and the switches 52, 62 are conductive. The operational amplifier 56 and capacitor 58 integrate the reference voltage $-V1$. The output signal of the operational amplifier 56 rises in a predetermined slope as shown in FIG. 4C.

When the output signal of the operational amplifier 56 becomes more positive than the reference voltage −V1, the output level of the comparator 66 is reversed and is thus changed from logical 0 to logical 1. The monostable multivibrator 84 delivers an output pulse of logical 1 as shown in FIG. 4G when it detects the edge of a rise of the output of the comparator 66. The output signal of the frequency divider 88 becomes logical 1 as shown in FIG. 4H, and the output signal of the frequency divider 92 is still logical 0 as shown in FIG. 4I. Consequently, the output signal $\phi 1$ of the AND gate 94 becomes logical 1, as shown in FIG. 4D, and the signal $\phi 3$ becomes logical 0, as shown in FIG. 4F. As shown in FIG. 4J, the AND gate 100 is enabled to supply the output pulse of the oscillator 86 to the down count terminal D of the counter 108 and to start a down count operation. The inverting input terminal of the comparator 66 is grounded through the switch 72.

When the output signal of the operational amplifier 56 rises to a ground level GND, the output signal of the comparator 66 becomes logical 1. The monostable multivibrator 84 delivers an output pulse of logical 1, as shown in FIG. 4G, when it detects the edge of a rise of the output signal from the comparator 66. Consequently, the output signal of the frequency divider 88 becomes logical 0 as shown in FIG. 4H. The output signal $\phi 1$ of the AND gate 44 becomes logical 0 as shown in FIG. 4D. The signal $\phi 3$ becomes logical 1 as shown in FIG. 4F. At this time, a down count operation of the counter 106 is completed as shown in FIG. 4J.

As the monostable multivibrator 104 detects the edge of a fall of the signal $\phi 1$ and supplies a pulse to the OR gate 80, the output level of the NOR gate 82 becomes logical 0, as shown in FIG. 4B, causing the switches 52, 62 to be nonconductive and the switches 60, 64 to be conductive. The output of the frequency divider 92 becomes logical 1 as shown in FIG. 4I when the output of the monostable multivibrator 84 falls. The operational amplifier 56 acts as a voltage follower and the output signal falls toward the negative power supply −V as shown in FIG. 4C.

As the output signal of the operational amplifier 56 becomes a reference voltage −V2, the output signal of the comparator 68 becomes logical 1 and the output signal of the NOR gate 82 becomes logical 1, as shown in FIG. 4B. Consequently, the states of the switches 52, 60, 62 and 64 are reversed and the operational amplifier 56 and capacitor 60 restart the integration of the reference voltage −V1. At this time, the inverting input terminal of the comparator 66 is connected through the switch 70 to the reference voltage terminal −V1 and, when the output signal of the operational amplifier 56 becomes a level −V1, the output signal of the comparator 66 changes from logical 0 to logical 1 and the monostable multivibrator 84 delivers an output pulse of logical 1 as shown in FIG. 4G. At the rise of this output pulse, the output signal of the frequency divider 88 becomes logical 1, as shown in FIG. 4H. The output signal $\phi 2$ of the AND gate 96 becomes logical 1 as shown in FIG. 4E. The output pulse signal of the oscillator 86 is supplied to the up count terminal U of the counter 108 through the AND gate 102 as shown in FIG. 4K. As the signal $\phi 2$ is logical 1, the signal $\phi 3$ becomes logical 0 as shown in FIG. 4F. Thereafter, the inverting input terminal of the comparator 66 is connected to the analog input terminal Ain. The output signal of the comparator 66 becomes logical 0.

When the output signal of the operational amplifier 56 rises and reaches the analog input level Ain, the output signal of the comparator 66 becomes logical 1 and the monostable multivibrator 84 delivers an output pulse of logical 1 as shown in FIG. 4G. By the edge of a rise of the output pulse, as shown in FIG. 4H, the output signal of the frequency divider 88 becomes logical 0. Thus, the signal $\phi 2$ of the AND gate 96 becomes a logical 0 as shown in FIG. 4E. The signal $\phi 3$ of the NOR gate 106 becomes logical 1 as shown in FIG. 4F. The AND gate 102 is nonconductive, thus stopping an up count operation of the counter 108 as shown in FIG. 4K. By the edge of a fall of the output pulse from the monostable multivibrator 84 the output signal of the frequency divider 92 becomes logical 1 as shown in FIG. 4I.

According to this embodiment, when the reference voltage −V1 is subjected to an integration, a digital value is obtained which corresponds to a time interval in which the output of the integrator varies from the ground level to the analog input level. In this way, the A/D conversion is performed. Although in the first embodiment separate comparators are used to compare the integration output with the two levels (GND and Ain), a single comparator 66 may be used as shown in the second embodiment. In this case, there is no chance that errors will be introduced into the A/D converter.

From the above it will be seen that according to this invention a high-speed analog to digital converter with good linearity and high accuracy is achieved through the utilization of the integrator.

What we claim is:

1. An analog to digital converter comprising:
   signal generating means operable as a voltage follower during a first period of analog-digital conversion for resetting the output signal of the signal generating means to a first predetermined reference level during said first period, said first reference level being input into said signal generating means in said first period, and operable as an integrator during a second period of time after said first period for generating an output signal monotonically varying from said first reference level at a predetermined rate during said second period;
   comparing means for comparing the output signal of said signal generating means with a second predetermined reference level and an analog input level during said second period, the magnitude of said second reference level being between said first reference level and said analog input level; and
   counting means counting clock pulses over a time interval in which the output signal level of said signal generating means is between said second reference level and said analog input level, said time interval being determined by the output signal of said comparing means.

2. An analog to digital converter according to claim 1, further comprising a capacitor and in which said signal generating means includes an operational amplifier which is supplied with said first reference level which is more negative than said second reference level where said analog input level is positive in response to a conversion start signal and acts as said voltage follower and, when a conversion start signal is terminated, causes said capacitor to be connected to input and output terminals thereof and acts as part of an integrator.

3. An analog to digital converter according to claim 1, further comprising a capacitor and in which said signal generating means includes an operational amplifier which is supplied with said first reference level which is more negative than said second reference level where said analog input level is positive in response to a conversion start signal and acts as a voltage follower and, when an output signal thereof becomes a predetermined negative level, causes said capacitor to be connected to input and output terminals thereof and acts as part of an integrator.

4. An analog to digital converter according to claim 1, in which said comparing means includes a first comparator circuit for outputting a signal when an output level of said signal generating means becomes more positive than said second reference level, a second comparator circuit for outputting a signal when an output level of said signal generating means becomes more positive than said analog input level which is positive, and said counting means comprises an oscillator, a flip-flop circuit set by the output of said first comparator circuit and reset by the output of said second comparator circuit, and a counter having a clock input terminal supplied with an output of said flip-flop circuit and an output of said oscillator through and AND gate.

5. An analog to digital converter according to claim 1, in which said comparing means has a comparator in which said second reference level and said analog input level are selectively used as a reference level.

6. An analog to digital converter according to claim 5, in which, where said analog input signal is positive, said signal generating means outputs a monotonically increasing signal and when an output level thereof becomes more positive than said second reference level the output level thereof falls to negative and again monotonically increases, said comparing means includes a comparator in which said second reference level, said first reference level more negative than said second reference level, and said analog input level are selectively used as a reference level, and said counting means includes a counter which starts a down count operation when an output level of said signal generating means is between said first reference level and said second reference level and which starts an up count operation when the output level of said signal generating means is between said first reference level and said analog input level.

* * * * *